United States Patent [19]

DiMaria et al.

[11] Patent Number: 4,939,559
[45] Date of Patent: Jul. 3, 1990

[54] DUAL ELECTRON INJECTOR STRUCTURES USING A CONDUCTIVE OXIDE BETWEEN INJECTORS

[75] Inventors: Donelli J. DiMaria, Ossining; David W. Dong, Peekskill, both of N.Y.

[73] Assignee: International Business Machines Corporation, Armonk, N.Y.

[21] Appl. No.: 847,127

[22] Filed: Apr. 1, 1986

Related U.S. Application Data

[63] Continuation of Ser. No. 701,815, Feb. 19, 1985, abandoned, which is a continuation of Ser. No. 330,913, Dec. 14, 1981, abandoned.

[51] Int. Cl.$^5$ .................... H01L 49/02; H01L 29/78; H01L 29/34
[52] U.S. Cl. ..................................... 357/23.5; 357/6; 357/23.15; 357/54
[58] Field of Search ..................... 357/6, 23.5, 23.15, 357/54; 365/185

[56] References Cited

U.S. PATENT DOCUMENTS

| | | | |
|---|---|---|---|
| 4,047,974 | 9/1977 | Harari | 357/54 |
| 4,162,505 | 7/1979 | Hanak | 357/54 |
| 4,334,292 | 6/1982 | Kotecha | 365/185 |
| 4,336,603 | 6/1982 | Kotecha | 365/185 |
| 4,363,110 | 12/1982 | Kalter et al. | 365/185 |
| 4,388,704 | 6/1983 | Bestin et al. | 365/185 |
| 4,399,522 | 8/1983 | Kotecha | 365/185 |

FOREIGN PATENT DOCUMENTS

0025311  3/1981  European Pat. Off. ............ 365/185

OTHER PUBLICATIONS

L. Farone et al., "Characterization of Thermally Oxidized n$^+$ Polycrystalline Silicon", *IEEE Transactions on Electron Devices*, vol. ED-32 (1985) pp. 577–583.

D. J. DiMaria et al., "Interface effects and High Conductivity in Oxides Grown From Polycrystalline Silicon", *Applied Physics Letters*, vol. 27, (1975) pp. 505–507.

R. M. Anderson et al., "Evidence for Surface Asperity Mechanism of Conductivity in Oxide Grown on Polycrystalline Silicon", *Journal of Applied Physics*, vol. 43 (1977) pp. 4834–4836.

Lee, Han-Sheng, "A New Approach for the Floating--Gate MOS Nonvolatile Memory", *Applied Physics Letters*, vol. 31, No. 7, Oct. 1, 1977.

DiMaria, D. J. et al., "Electrically-Alterable Memory Using a Dual Electron Injector Structure", *IEEE Electron Device Letters*, vol. EDL-1, No. 9, Sep., 1980.

D. J. DiMaria, "Graded or Stepped Energy Band-Gap Insulator MIS Structures (GI-MIS for SI-MIS)", J. Appl. Phys., 50, p. 5826, 1979.

(List continued on next page.)

*Primary Examiner*—J. Carroll
*Attorney, Agent, or Firm*—Thomas J. Kilgannon, Jr.

[57] ABSTRACT

The present invention relates to DEIS (Dual Electron Injector Structure) EAROM (Electrically Alterable Read Only Memory) devices which utilize a silicon-rich, silicon dioxide insulator between injectors which has an excess of silicon therein which is less than the excess of silicon in the silicon rich, silicon dioxide injectors. The device does not depart in any way from known DEIS EAROM devices except that the insulator layer between the injectors is rendered conductive to a desired degree by causing a compound insulator like $SiO_2$ to be off-stoichiometry during deposition so that the resulting insulator becomes silicon rich. Alternatively, the insulator may be deposited together with another metal which renders the insulator conductive or a metallic specie may be added to the insulator by diffusion or ion implantation after the insulator is formed. The resulting conductive insulator provides a means for draining off trapped charge in the insulator resulting in a device of such improved cyclibility that the DEIS EAROM can be used as a Non-Volatile Random Access Memory (NVRAM) capable of from $10^8$ to greater than $10^{10}$ cycles before threshold collapse occurs. The conductive insulator is designed so that it is conductive only at high electric fields encountered during writing and erasing and highly blocking at low fields encountered during reading or storage operations.

33 Claims, 4 Drawing Sheets

OTHER PUBLICATIONS

D. J. DiMaria et al, "High Current Injection into $SiO_2$ From Si-Rich $SiO_2$ Films and Experimental Applications", J. Appl. Phys. 51, (5) May 1980, pp. 2722–2735.

D. J. DiMaria et al, "Electrically-Alterable Read-Only-Memory using Si-Rich $SiO_2$ Injectors and a Floating Polycrystalline Silicon Storage Layer", J. Appl. Phys., 52 (7), Jul. 1981, pp. 4825–4842.

D. J. DiMaria et al, "Dual-Electron-Injector-Structure Electrically Alterable Read-Only-Memory Modeling Studies", IEEE Transactions on Electron Devices, ED-28, pp. 1047–1053, 1981.

DUAL ELECTRON INJECTOR STRUCTURES USING A CONDUCTIVE OXIDE BETWEEN INJECTORS

This application is a continuation of application Ser. No. 701,815, filed Feb. 19, 1985, abandoned, which is a continuation of application Ser. No. 330,913 filed Dec. 14, 1981, abandoned.

DESCRIPTION

1. Technical Field

This invention relates to an improved dual injector, non-volatile memory device. More specifically the invention is directed to a non-volatile memory device in which the dual injectors are vertically positioned in a stack relative to control and floating gates and are spaced from each other by a conductive oxide to minimize trapped charge build-up in the oxide.

2. Background of the Invention

Semiconductor structures having Si-rich $SiO_2$ and Si-rich $Si_3N_4$ layers deposited on top of an $SiO_2$ insulator have been demonstrated in past. The Si-rich layers permit high electron current injection into the $SiO_2$ layer at moderate electric fields. These structures have been found feasible in non-volatile semiconductor memory devices.

U.S. Pat. No. 4,104,675 assigned to a common assignee discloses a device which uses a graded band gap structure including a region having a graded concentration of Si therein to make a charge storage device wherein injection of holes or electrons from one contact is possible without simultaneous injection of electrons or holes from the other contact. The patent shows a structure employing the band gap reduction in a GOMOS FET which performs a memory function. The GOMOS structure employs hole trapping near the Si-$SiO_2$ interface with the structure in an FET configuration. The "write" step involves hole injection from the gate electrode under moderate positive voltage bias and transport to the Si-$SiO_2$ interface where some of the positively-charged holes are trapped in a very stable manner. The "erase" step involves electron injection from the gate electrode under moderate negative voltage bias and transport to the Si-$SiO_2$ interface where electrons annihilate trapped holes very readily. The "read" operation uses the conductance of the silicon surface to sense the charge state of the oxide region near the Si-$SiO_2$ interface and uses low gate voltages to prevent further charging of this region.

The graded or stepped concentration structure may be fabricated by forming several pyrolytic or CVD $SiO_2$ layers over a relatively thick thermal $SiO_2$ layer with the pyrolytic $SiO_2$ layers having sequentially increasing excess Si content. For stepped structures, one or more layers of constant Si concentrations are used. The structure may also be fabricated by controlled Si ion implantation into the thermal $SiO_2$ layer. The structure can also be fabricated using plasma deposited layers of $SiO_2$ graded with Si. Other insulating layers which give enhanced carrier injection from the gate electrode due to actual band gap reduction or effective band gap reduction (for instance, by trap-assisted tunneling) are also possible The devices shown in U.S. Pat. No. 4,104,675 suffer from surface state build-up at the Si-$SiO_2$ interface due to the passage of holes; are sensitive to "hot" carrier injection from the Si substrate due to the presence of the trapped holes and require hole injection and trapping as a first operation since these traps do not capture electrons in the absence of holes.

In reissue U.S. Pat. No. Re. 31,083, issued Nov. 16, 1982, assigned to a common assignee, there is shown an improved graded or stepped silicon concentration structure wherein injection of holes or electrons from one contact is possible without compensating injection of electrons or holes from the other contact. The improvement is the inclusion of a charge trapping layer in the thick insulator region adjacent to the silicon semiconducting body. The trapping layer is situated at a distance of approximately 50 Å or more from the Si-insulator interface to prevent trapped carriers from tunneling from this layer to the Si substrate.

The above mentioned trapping layer captures and stores either electrons (write operation) or holes (erase operation) with as close to 100% efficiency as possible. Novel electrically-alterable read-only-memory (EAROM) devices using the invention in metal-insulator-semiconductor structures are further described.

The structure is fabricated by forming several pyrolytic or CVD $SiO_2$ layers over a relatively thick thermal $SiO_2$ with the pyrolytic $SiO_2$ layers having sequentially increasing excess Si content. The trapping layer is formed by controlled impurity ion-implantation or by diffusion of the impurity into the relatively thick thermal $SiO_2$ layer. In an alternative approach, the trapping layer is formed by deposition of the impurity on thermal $SiO_2$ with stoichiometric CVD $SiO_2$ isolating it from the injector region which consists of the Si-rich CVD $SiO_2$ layers.

These structures have the limitation of being only a good single carrier electron injector since few holes are injected under conditions of opposite polarity. Consequently, when used in memory devices, "erase" times are long (minutes) as compared to write times (milliseconds). See, for example, the publications to D. J. DiMaria, entitled "Graded or Stepped Energy Band-Gap Insulator MIS Structures (GI-MIS for SI-MIS)" J. Appl. Phys., 50, (9) to D. J. DiMaria et al, entitled "High Current Injection into $SiO_2$ From Si-Rich $SiO_2$ Films and Experimental Applications", J. Appl. Phys. 51, (5) May 1980, pp. 2722–2735.

Still more recently, an improvement of the above described prior art single injector structures was provided in a U.S. patent application Ser. No. 701,815 (filed 2-19-85) assigned to a common assignee. The improvement is the addition of a vertically positioned second injector proximate to a trapping layer or floating gate structure in the insulator layer. The dual injector structure so provided can now effectively inject holes as easily as electrons are injested. When used in a memory device, it provides erase times equivalent to the write times obtained in the single injector memory device. An example of a structure employing the dual injector is an MGOS FET to perform a memory function More specifically, the MGOS structure employs a charge trapping layer or floating gate near the Si-$SiO_2$ interface of the gate structure in an FET configuration. In the memory contemplated by that invention, layers of Si-rich $SiO_2$—$SiO_2$—Si-rich $SiO_2$ disposed between the control gate and trapping layer or floating gate of the device are provided. The resulting insulator stack was characterized as a Dual Electron Injector Structure (DEIS). Writing and erasing are performed by applying negative and positive voltages, respectively, to the control gate.

The latter injects electrons from the top and bottom injector to the floating gate or back to the control gate.

The operation, fabrication and characteristics of the above described device are discussed in detail in an article entitled, "Electrically-alterable read-only-memory using Si-rich SiO$_2$ injectors and a floating polycrystalline silicon storage layer" by D. J. DiMaria et al, J. Appl. Phys. 52 (7), July 1981, 4825–4842. In this article, attention is particularly directed to the fact that the DEIS (Dual Electron Injector Structure) EAROM experiences a phenomenon called threshold collapse after a device has been subjected to writing and erasing functions between $10^4$ and $10^6$ cycles. This is due to electronic charge trapping in the SiO$_2$ insulator disposed between the Si-rich SiO$_2$ layers. To the extent that the prior art device experiences threshold collapse at between $10^4$ and $10^6$ cycles, the DEIS EAROM cannot be extended to a pure Non-Volatile Random-Access-Memory (NVRAM).

It is, therefore, a principal object of this invention to provide a pure Non-Volatile Random-Access-Memory (NVRAM) device which is not subject to threshold collapse for $10^8$ cycles and beyond.

It is another object of the present invention to provide an NVRAM device in which electronic charge trapping in the SiO$_2$ layer is minimized.

It is another object of the present invention to provide an NVRAM device in which the composition of the intervening SiO$_2$ layer is conductive at the high electric fields used for writing and erasing the device and highly blocking to the motion of charge between gates at the low fields used for reading or storage.

BRIEF SUMMARY OF THE INVENTION

The present invention relates to DEIS (Dual Electron Injector Structure) EAROM (Electrically Alterable Read Only Memory) devices which utilize a silicon-rich silicon dioxide insulator between injectors which has an excess of silicon therein which is less than the excess of silicon in the silicon rich silicon dioxide injectors. The device does not depart in any way from known DEIS EAROM devices except that the insulator layer between the injectors is rendered conductive to a desired degree by causing a compound insulator like SiO$_2$ to be off-stoichiometry during deposition so that the resulting insulator becomes silicon rich. Alternatively, the insulator may be deposited together with another metal which renders the insulator conductive or a metallic species may be added to the insulator by diffusion or ion implantation after the insulator is formed. The resulting conductive insulator effectively provides a means for draining off trapped charge in the insulator resulting in a device of such improved cyclibility that the DEIS EAROM can be used as a Non-Volatile Random Access Memory (NVRAM) capable of from $10^8$ to greater than $10^{10}$ cycles before threshold voltage window collapse occurs. The fact that any permanent charge trapping occurs at all results from the finite probability of the capture, into deep SiO$_2$ gap states, of a few carriers that are actually injected into the oxide conduction band.

The conductive insulator is designed so that it is conductive at high electric fields encountered during writing and erasing and highly blocking at low fields encountered during reading or storage operations.

These and other objects, features and advantages will be more apparent from the following more particular description of the preferred embodiment.

DESCRIPTION OF THE PREFERRED EMBODIMENT

Figure 1:
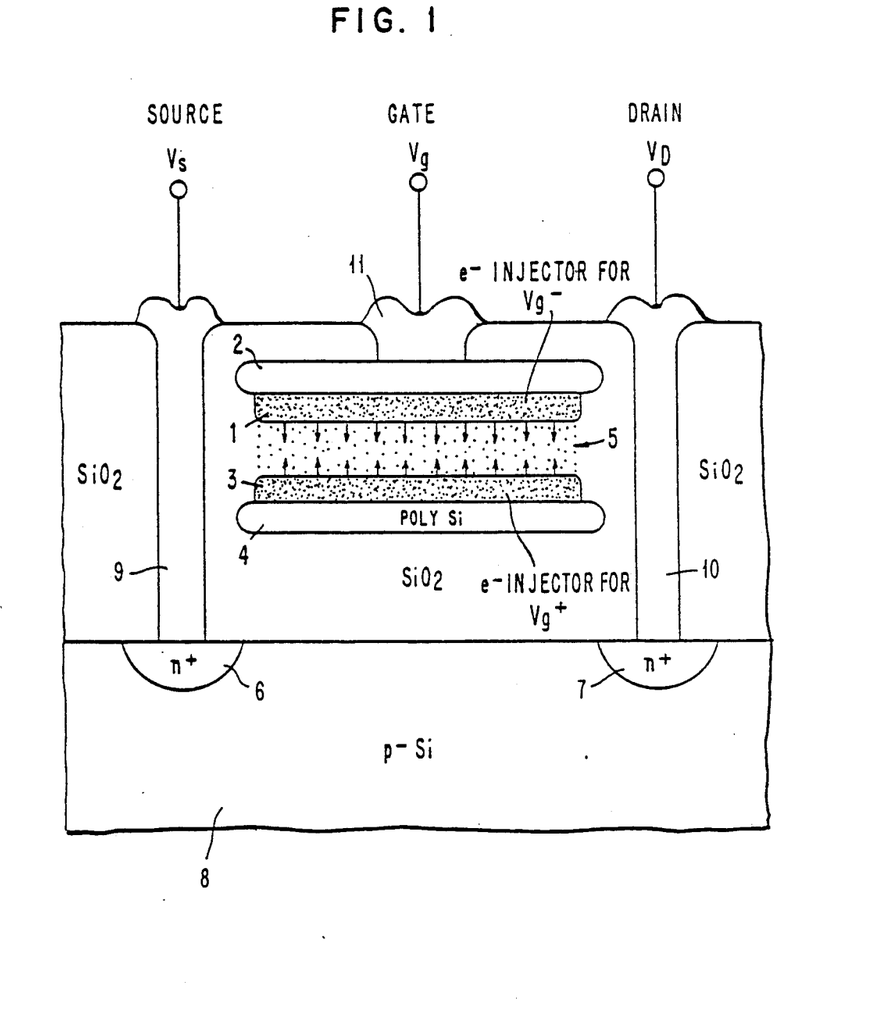
FIG. 1 is a schematic representation of a non-volatile n-channel FET memory device using dual injectors and having a conductive insulator disposed between these injectors which minimizes the build-up of trapped charge in the device relative to that found in devices with the usual stoichiometric insulators.

Referring now to FIG. 1, the dual electron injector of the non-volatile, n-channel, FET memory device of the present invention is composed of a Si-rich SiO$_2$ region 1 which is contiguous with and beneath a polysilicon or metal gate region 2 and a second Si-rich SiO$_2$ region 3 which is contiguous with and atop a floating gate region 4. The latter may be made of polysilicon or metal. Regions 1,3 are separated by means of an SiO$_2$ area 5 which has been rendered slightly conductive by the addition of 1–6% atomic Si to drain off trapped charge in this volume. As a result, the ability to cycle the device of FIG. 1 between written and erased states is improved to greater than $10^8$ cycles. Si-rich SiO$_2$ area 5 is provided by the chemical vapor deposition of SiO$_2$ which is off stoichiometry to the extent it contains about 1–6% excess atomic Si.

Si-rich SiO$_2$ regions 1,3 have graded or stepped concentrations of Si which are prepared by the chemical vapor deposition of a plurality of SiO$_2$ layers having varying concentrations of Si. The number of layers, the thickness of each layer, and the concentration of excess Si in each successive layer making up region 1,3 is a matter of design choice. Increasing the Si content of the Si-rich SiO$_2$ regions 1,3 enhances the electron injection capability, thereby decreasing write and/or erase voltages and/or times. A preferred excess Si content for layers 1,3 is from about 46% to about 60% atomic Si representing excess silicon contents of 13% and 27%, respectively, over the content of silicon in stoichiometric SiO$_2$ which is approximately 33%. The operation of there injectors is, therefore, not very sensitive to injector thickness (from 100 Å to 1000 Å) or to the exact Si content to within a few percent because the interfaces of the low resistance Si-rich SiO2 layers 1,3 with the higher resistance layer 5 control the electron injection phenomenon.

In FIG. 1, first and second n+ regions 6,7, respectively, are shown formed in a p- silicon substrate 8. Voltages $V_s$, $V_D$ and $V_g$, otherwise identified in FIG. 1 by the captions SOURCE, DRAIN and GATE, respectively, are connected via metallizations 9,10 and 11 to n+ region 6, n+ region 7 and polysilicon gate 2, respectively.

The FET structure shown in FIG. 1 may be fabricated using a self-aligned, double poly-Si process. After defining thick field oxide regions (not shown), the exposed substrate portion of the device of FIG. 1 is subjected to a thermal oxidation step which forms a layer of $SiO_2$ in the thickness range from 50–1000 Å on the surface of the substrate. The latter is a 0.5 Ωcm (100), p-type, single crystal silicon substrate. Next, a 2000 Å thick polysilicon layer is deposited and doped n-degenerate with $POCl_3$ in a well known manner to form the floating charge storage layer 4 of FIG. 1. The injector stack comprised of layers 3,5,1 of FIG. 1 consists of Chemically Vapor Deposited (CVD) silicon-rich silicon dioxide layers wherein layer 5 is silicon rich to a lesser extent than the silicon richness of layers 3,1 of FIG. 1. The silicon richness of the layers is controlled during deposition by controlling the gaseous concentration ratio of $N_2O$ to $SiH_4$ in the CVD reactor. Thus, where the ratio is 200 for deposition of a layer of pure $SiO_2$, it is reduced to 50 to provide an $SiO_2$ layer which has a 1–3% excess of silicon in it. Thus, where stoichiometric $SiO_2$ has approximately 33% atomic Si in it, the Si-rich $SiO_2$ having an excess of 1–3% atomic Si in it would now contain 34–36% atomic Si.

In a preferred embodiment, injectors 1,3 may be deposited by chemical vapor deposition in a range of thicknesses of 100 Å–200 Å and contain excess silicon in a range of 1–13 percent atomic silicon. Layer 5 may be deposited in a thickness range of 150 Å–600 Å and contain excess silicon in a range of 1–6 percent atomic silicon representing excess silicon contents of 34 to 39% atomic silicon, respectively, over the content of silicon in stoichrometric $SiO_2$ which is approximately 33% atomic silicon.

After deposition of injector 1, a 2000 Å thick polysilicon, n-degenerate layer similar to layer 4 is deposited and doped. In a succeeding step, plasma etching, reactive ion etching and wet etching are used to define source and drain. Source and drain are then diffused in a well known way and a 1000 Å thick oxide is regrown at 1000° C. over the source and drain. A protective 3000 Å layer of CVD $SiO_2$ followed by a phosphosilicate glass (PSG) passivation are deposited and annealed at 1000° C. Finally, contact holes to the source, drain and polysilicon gate 2 are defined and etched, followed by the formation of palladium silicide ($Pd_2Si$) and aluminum metallizations. A 400° C. anneal for 20 minutes in forming gas (90% $N_2$–10% $H_2$) completes the process.

CVD silicon-rich silicon dioxide layers 1,3 are deposited at 700° C. using a ratio of concentrations of $N_2O$ to $SiH_4$ in the gas phase of 3 and, under such conditions, contain 46% atomic silicon or 13% excess silicon over that found in pure $SiO_2$. From the foregoing, it should be clear that by simply adjusting the above mentioned ratio, the amount of silicon richness can be easily controlled.

An exemplary device fabricated using the above outlined process has a channel length of $2.5 \times 10^{-4}$ cm after photolithography, but is effectively about $1.8 \times 10^{-4}$ cm after diffusion drive in and subsequent high temperature processing. The channel width is $4.0 \times 10^{-4}$ cm and the FET channel area $7.2 \times 10^{-8}$ cm$^2$. The actual injecting area for writing and erasing can be smaller, for example, $2.5 \times 10^{-4}$ cm $\times 2 \times 10^{-4}$ cm $= 5 \times 10^{-8}$ cm$^2$.

Figure 4:
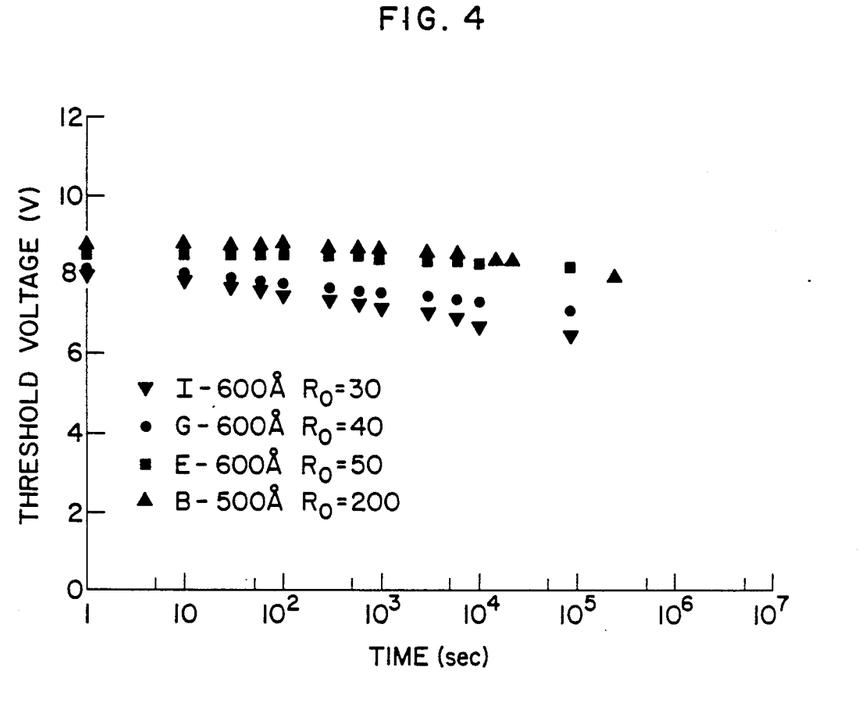
FIG. 4 is a graph of threshold voltage variation with time (secs) for insulators having R$_o$ values of 30, 40, 50 and 200. This graph shows that for relatively moderate values of resistivity of the insulator (corresponding to low values of R$_o$) electron leakage from a floating gate to a control gate is approximately the same as the leakage for a pure insulator.

The FET DEIS structure of FIG. 1 is placed in the write or erase modes by using moderate gate voltages between −5V and −40V and +5V and +40V, respectively, on the control gate electrode 11, the exact voltage magnitude depending on device configuration. Other device configurations with three or more ports which use only positive voltages for either the write or erase operations have been discussed in the article entitled "Dual-Electron-Injector structure Electrically Alterable Read-Only-Memory Modeling Studies", by D. J. DiMaria et al, IEEE Transactions on Electron Devices, ED-28, pp. 1047–1053, 1981. Once floating gate 4 is charged positively or negatively, the device can be read with voltages between 0 to +5V on control gate 2 and a small voltage applied between the source and drain 7. If the structure is in the erased or written state, either current or no current will flow, respectively, in the FET channel between source 6 and drain 7. This structure has good charge retention either grounded or floating (at least for periods of one day at 25° C.) as shown in FIG. 4, and thus serves as a non-volatile memory. It can be cycled approximately $10^6$ to $10^8$ times as opposed to prior art arrangements which could be cycled $10^3$ to $10^5$ times. As with the prior art, the threshold voltage window collapse is ultimately caused by trapped charge buildup in the CVD Si enriched $SiO_2$ region 5.

Figure 2:
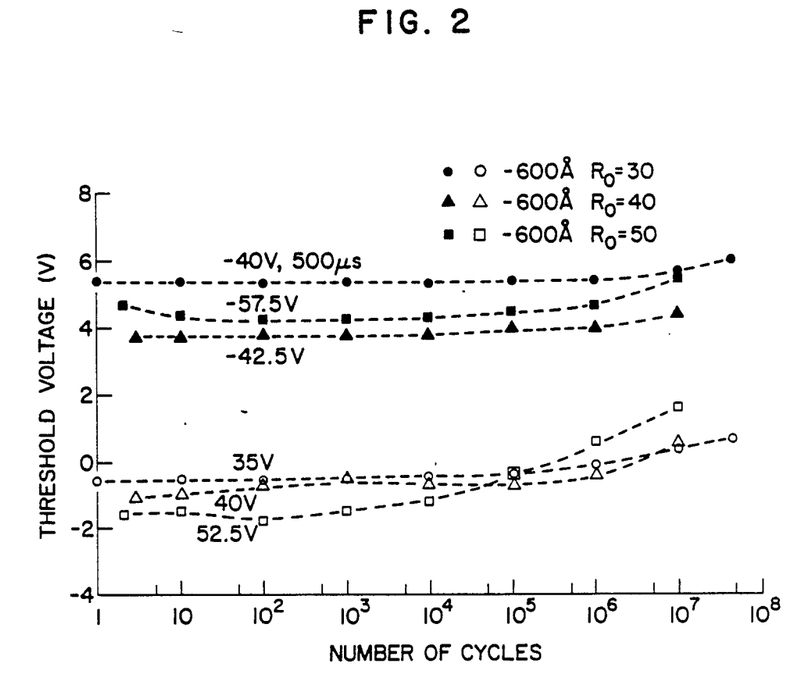
FIG. 2 is a graph showing the variations in threshold voltage with the number of write and erase cycles for three different values of resistivity of the conductive insulator disposed between injectors. For cycles in excess of $10^6$ cycles, the devices are tending toward threshold collapse.

Referring now to FIG. 2 there is shown therein the variation in threshold voltage with the number of write and erase cycles for three different values of resistivity ($R_o$=50 being indicative of the most resistive intervening off-stoichiometry $SiO_2$ layer) of the conductive insulator 5 disposed between injectors or layers 1,3. To obtain this data devices similar to that described hereinabove were utilized except that the conductive insulator region 5 was formed with different amounts of excess silicon. The conductive insulator in all instances was 600 Å thick while the resistivity values were 30, 40 and 50 signifying approximately 5–6% excess atomic silicon, approximately 3–4% excess atomic silicon and approximately 1–2% excess atomic silicon, respectively. It should be noted that the onset of threshold collapse which is due to the storing of trapped charge in the conductive insulator 5 does not begin until after at least $10^6$ cycles. Writing is performed by applying a negative voltage $V_g^-$ to control gate 2 which injects electrons from the silicon-rich silicon dioxide injector or layer 1 into the intervening oxide layer 5 which then flow in the electric field to the floating polysilicon gate 4. Erasing is performed by applying a positive voltage $V_g^+$ to control gate 2 which injects electrons from the bottom silicon-rich silicon dioxide injector 3 back to control gate 2. The negative and positive voltages shown with the curves are those utilized for writing and erasing, respectively. In all instances, the voltages were applied for 500 microseconds. The introduction of silicon to render the normally insulating layer 5 slightly conductive does not prevent ultimate threshold voltage collapse. This expedient, however, does extend the ability to cycle beyond $10^{10}$ cycles before threshold voltage collapse occurs.

One explanation is that the probability of capture of electrons in layer 5 becomes more and more likely as the device is cycled between its write and erase function and the total charge that has flowed back and forth between the control and floating gate increases.

Figure 3:
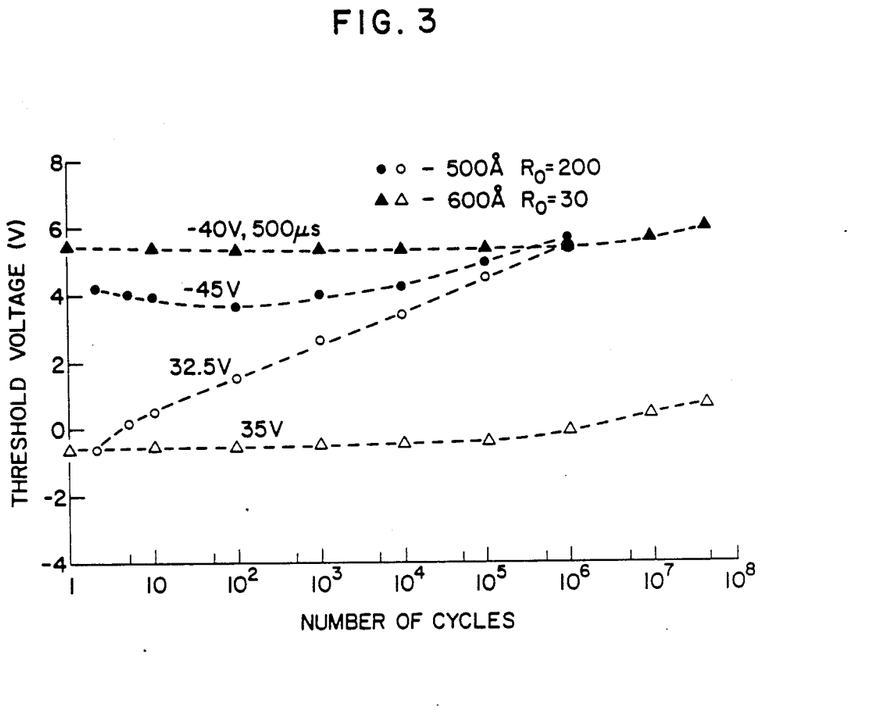
FIG. 3 is a graph similar to that shown in FIG. 2 which shows that, for high values of R$_o$ (where R$_o$ is the ratio of N$_2$O to SiH$_4$ in the gas phase in the CVD reactor) representing pure SiO$_2$, total threshold collapse occurs before $10^3$ cycles, while, for lower values of R$_o$, threshold collapse does not occur for cycles in excess of $10^7$.

FIG. 3 is a graph similar to that shown in FIG. 2 which shows that for a high value of $R_o$ equal to 200 which represents pure silicon dioxide, total threshold collapse occurs before $10^6$ cycles while for a lower value of $R_o$ equal 30, threshold collapse does not occur until after $10^7$ cycles.

FIG. 4 is a graph of threshold voltage variation with time for devices with regions 5 of FIG. 1 having $R_o$ values of 30, 40, 50, and 200. This graph shows that for relatively high values of resistivity (for example, $R_o$ equal to 50), electron leakage from a floating gate to a control gate is approximately the same as the leakage for a pure $SiO_2$ insulator ($R_o$=200).

The use of a conductive insulating region between silicon-rich silicon dioxide injectors enhances the ability to cycle a device between its write and erase modes. To the extent that lower writing and erasing voltages result from the use of a slightly conductive insulator, power dissipation in such devices is decreased. In addition, the voltages utilized to write and erase become approximately the same value. While the above improvements come about as a result of adding more silicon to the silicon dioxide insulator, it should be appreciated that retention of charge is only slightly degraded.

The distribution of the conductive material in regions 1,3,5 is not critical. The conductive material may be uniformly or nonuniformly distributed in these regions. Each region may be formed of a plurality of layers each having a different concentration of conductive material so that the concentration is graded from one interface to another interface.

Also, it should be appreciated that, while the teaching of the present application has been exemplified using n-channel FET, p-channel FET's may also be utilized without departing from the spirit of the present invention.

While the materials silicon and silicon dioxide have been emphasized as the preferred materials, it should be appreciated that other cermets such as aluminum oxide and silicon nitride and practically any metal or semimetal including silver, gold, tantalum, silicon and aluminum but not limited to these metals, may also be utilized in the practice of the present invention with the same results. Obviously, insulating materials and metals which are compatible with each other and with semiconductor processing techniques will find wider use than other material combinations which do not lend themselves so readily to semiconductor processing.

Having thus described our invention, what we claim as new, and desire to secure by Letters Patent is:

1. A dual electron injector structure comprising first, second and third vertically disposed insulator regions each containing excess conductive material sufficient to render said regions conductive said second region being less conductive than and contiguous with said first and third regions.

2. A dual electron injector structure according to claim 1 further including first and second conductive elements disposed in contact with said first and third regions, respectively.

3. A dual electron injector structure according to claim 1 wherein said insulator regions are cermets.

4. A dual electron injector structure according to claim 1 wherein said excess conductive material is a metal.

5. A dual electron injector structure according to claim 1 wherein said excess conductive material is a semimetal.

6. A dual electron injector structure according to claim 1 wherein said excess conductive material is distributed uniformly in said first, second and third regions.

7. A dual electron injector structure according to claim 1 wherein said excess conductive material is distributed nonuniformly in said first, second and third regions.

8. A dual electron injector structure according to claim 1 wherein said insulator regions are made of insulators selected from the group consisting of silicon dioxide, aluminum oxide and silicon nitride.

9. A dual electron injector structure according to claim 1 wherein said excess conductive material is silicon.

10. A dual electron injector structure according to claim 1 wherein said insulator regions are silicon dioxide and said excess conductive material is silicon.

11. A dual electron injector structure according to claim 10 wherein said first and third silicon dioxide regions contain excess silicon over that found in stoichiometric silicon dioxide 33% atomic silicon in an amount up to 60% atomic silicon and wherein said second silicon dioxide region contains excess silicon over that found in stoichiometric silicon dioxide in an amount up to 39% atomic silicon.

12. A dual electron injector structure comprising first, second and third vertically disposed insulator regions, said second region being sandwiched between said first and third regions each of said regions containing excess conductive material sufficient to render said regions conductive, said second region being less conductive than and contiguous with said first and third regions.

13. A dual electron injector structure according to claim 12 further including first and second conductive elements disposed in contact with said first and third regions, respectively.

14. A dual electron injector structure according to claim 12 wherein said insulator regions are cermets.

15. A dual electron injector structure according to claim 12 wherein said excess conductive material is a metal.

16. A dual electron injector structure according to claim 12 wherein said excess conductive material is a semimetal.

17. A dual electron injector structure according to claim 12 wherein said excess conductive material is distributed uniformly in said first, second and third regions.

18. A dual electron injector structure according to claim 12 wherein said excess conductive material is distributed nonuniformly in said first, second and third regions.

19. A dual electron injector structure according to claim 12 wherein said insulator regions are made of insulators selected from the group consisting of silicon dioxide, aluminum oxide and silicon nitride.

20. A dual electron injector structure according to claim 12 wherein said excess conductive material is silicon.

21. A dual electron injector structure according to claim 12 wherein said insulator, regions are silicon dioxide and said excess conductive material is silicon.

22. A dual electron injector structure according to claim 21 wherein said first and third silicon dioxide regions contain excess silicon over that found in stoichiometric silicon dioxide 33% atomic silicon in an amount up to 60% atomic silicon and wherein said second silicon dioxide region contains excess silicon over that found in stoichiometric silicon dioxide in an amount up to 39% atomic silicon.

23. A semiconductor memory device comprising a semiconductor substrate of one conductivity type having a pair of regions of opposite conductivity type disposed therein and forming a channel region therebetween;
   an insulating layer formed over said channel region, and
   a dual electron injector structure formed over said substrate said structure comprising first, second and third vertically disposed insulator regions, said second region being sandwiched between said first and third regions each of said regions containing excess conductive material sufficient to render said regions conductive, said second region being less conductive than and contiguous with said first and third regions.

24. A dual electron injector structure according to claim 23 further including a gate electrode and a floating gate electrode disposed over said substrate.

25. A dual electron injector structure according to claim 23 wherein said insulator regions are cermets.

26. A dual electron injector structure according to claim 23 wherein said excess conductive material is a metal.

27. A dual electron injector structure according to claim 23 wherein said excess conductive material is a semimetal.

28. A dual electron injector structure according to claim 23 wherein said excess conductive material is distributed uniformly in said first, second and third regions.

29. A dual electron injector structure according to claim 23 wherein said excess conductive material is distributed nonuniformly in said first, second and third regions.

30. A dual electron injector structure according to claim 23 wherein said insulator regions are made of insulators selected from the group consisting of silicon dioxide, aluminum oxide and silicon nitride.

31. A dual electron injector structure according to claim 23 wherein said excess conductive material is silicon.

32. A dual electron injector structure according to claim 23 wherein said insulator regions are silicon dioxide and said excess conductive material is silicon.

33. A dual electron injector structure according to claim 32 wherein said first and third dioxide regions contain excess silicon over that found in stoichiometric silicon dioxide 33% atomic silicon in an amount up to 60% atomic silicon and wherein said second silicon dioxide contains excess silicon over that found in stoichiometric silicon dioxide in an amount up to 39% atomic silicon.

* * * * *